United States Patent [19]

Starck et al.

[11] Patent Number: 6,071,829
[45] Date of Patent: Jun. 6, 2000

[54] METHOD OF FABRICATING SEMICONDUCTOR COMPONENTS

[75] Inventors: Christophe Starck, Ste Genevieve des-Bois; Lionel Le Gouezigou, Le Val Saint Germain, both of France

[73] Assignee: Alcatel, Paris, France

[21] Appl. No.: 09/099,950

[22] Filed: Jun. 19, 1998

[30] Foreign Application Priority Data

Jun. 19, 1997 [FR] France .................................. 97 07635

[51] Int. Cl.[7] ................................................. H01L 21/461
[52] U.S. Cl. ........................... 438/746; 438/31; 438/32; 438/707; 438/708; 438/712; 438/714
[58] Field of Search ................................... 438/746, 707, 438/708, 709, 712, 714, 31, 32

[56] References Cited

U.S. PATENT DOCUMENTS

| | | | |
|---|---|---|---|
| 4,177,094 | 12/1979 | Kroon | 117/85 |
| 4,367,044 | 1/1983 | Booth, Jr. et al. | 356/357 |
| 4,660,979 | 4/1987 | Muething | 356/357 |
| 4,839,311 | 6/1989 | Riley et al. | 438/14 |
| 4,910,583 | 3/1990 | Behr et al. | 257/712 |
| 5,395,769 | 3/1995 | Arienzo et al. | 438/8 |
| 5,633,193 | 5/1997 | Baillargeon et al. | 438/32 |
| 5,796,768 | 8/1998 | Mersali et al. | 372/45 |
| 5,805,755 | 9/1998 | Amersfoort et al. | 385/131 |

FOREIGN PATENT DOCUMENTS 0 768 512 A2   4/1997   European Pat. Off. .

*Primary Examiner*—Carl Whitehead, Jr.
*Assistant Examiner*—Khanh Duong
*Attorney, Agent, or Firm*—Suhgrue, Mion, Zinn, Macpeak & Seas, PLLC

[57] ABSTRACT

A method of fabricating a semiconductor component, the method including at least one step of etching an upper layer formed on a substrate. In the method, prior to forming the upper layer, at least one set made up of marker layers separated by intermediate layers of predetermined thicknesses is caused to be grown, where the marker layers and adjacent intermediate layers have different refractive indices, and then during etching of the upper layer refractive index discontinuities are detected optically and etching is stopped when the sequence of the optically detected discontinuities corresponds to a reference sequence representative of the thicknesses of the intermediate layers.

3 Claims, 3 Drawing Sheets

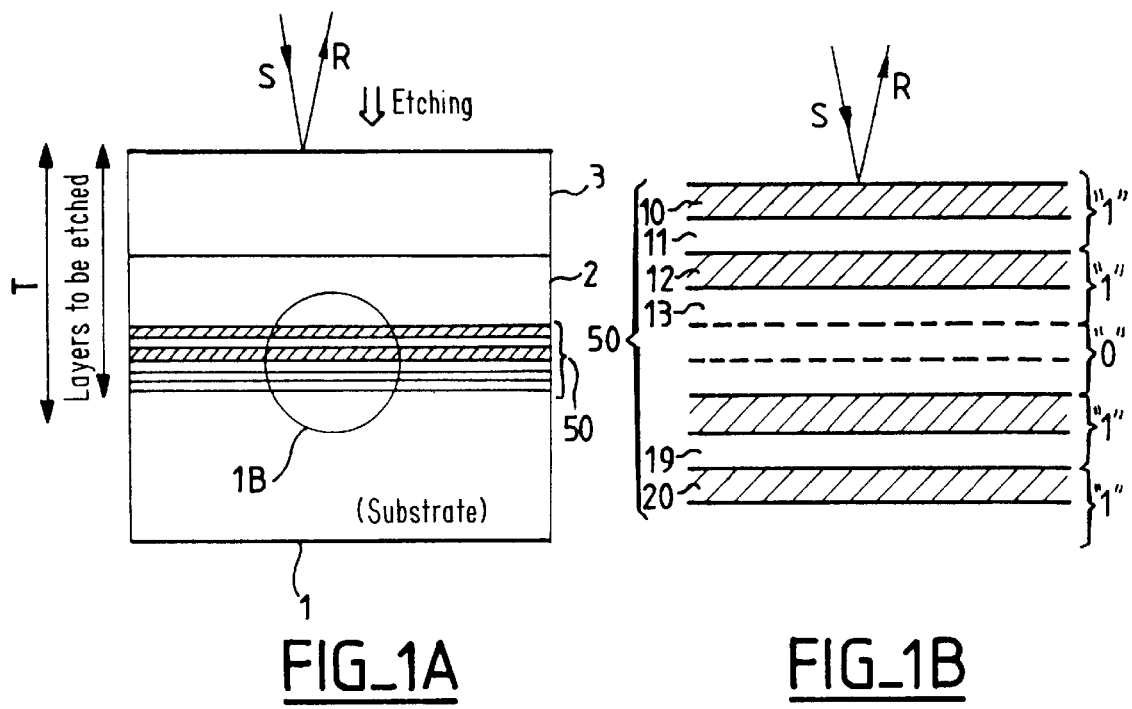
FIG_1A  FIG_1B
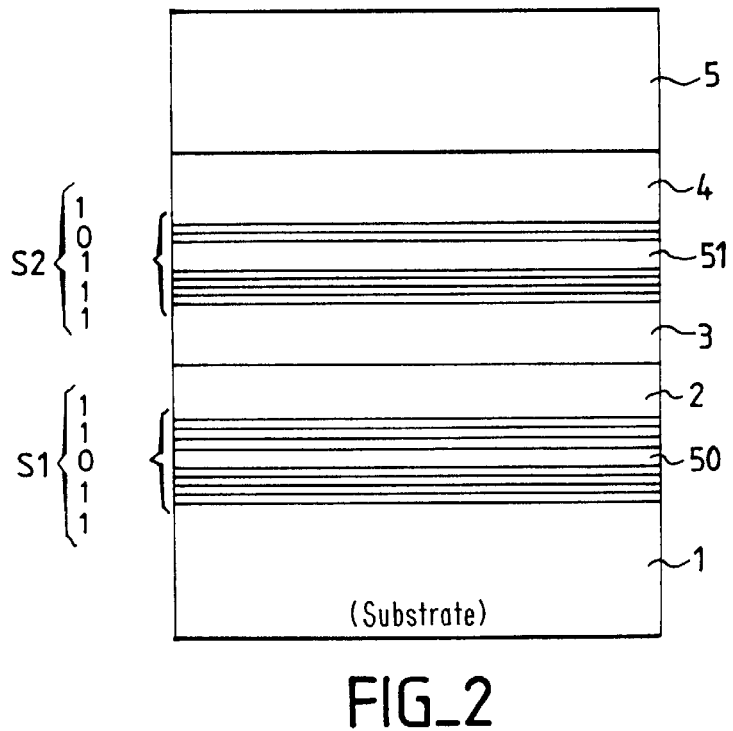
FIG_2

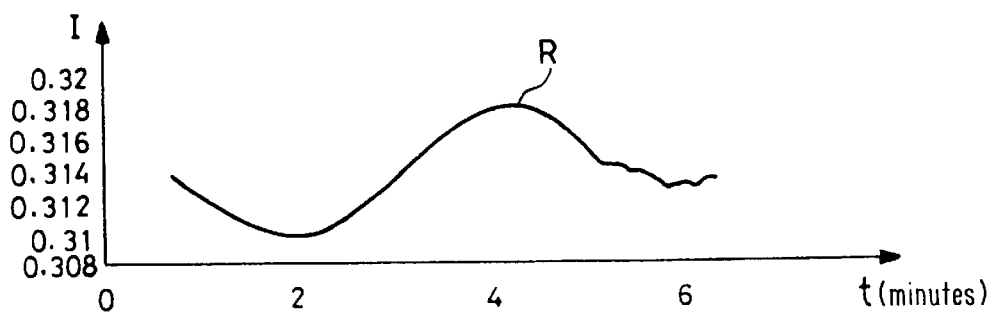
FIG_3
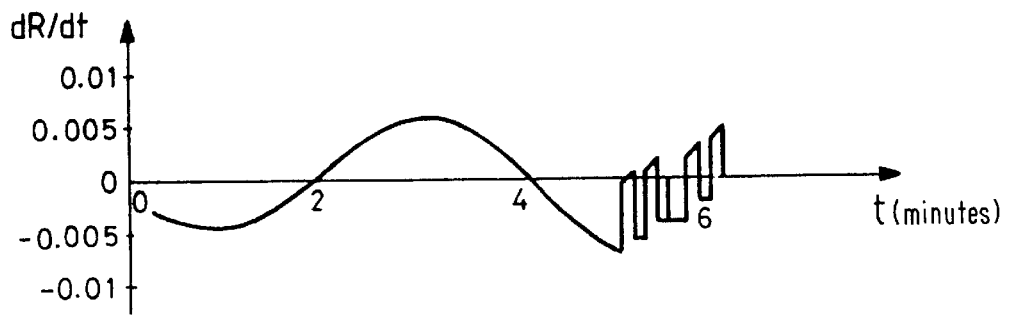
FIG_4
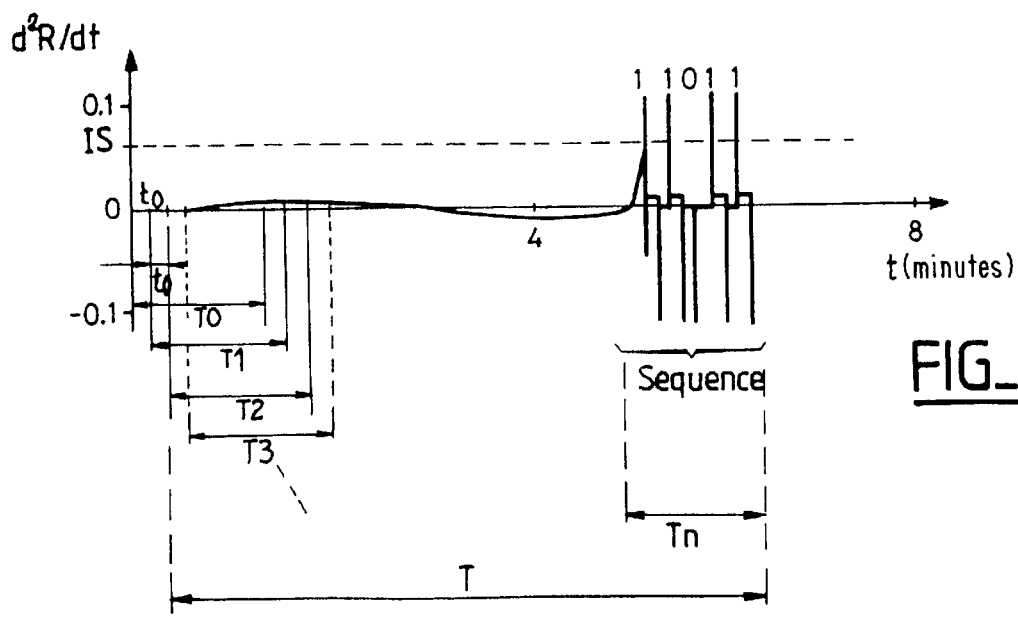
FIG_5

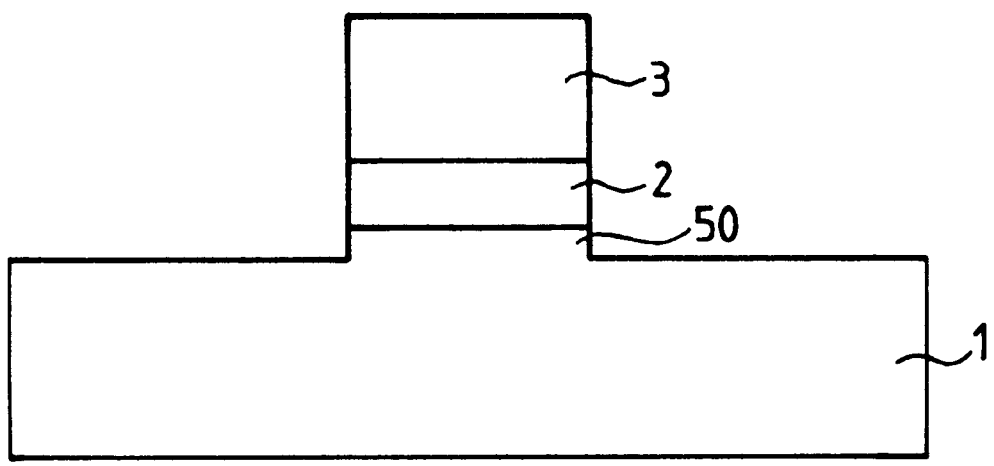
FIG_6

METHOD OF FABRICATING SEMICONDUCTOR COMPONENTS

The invention relates to a method of fabricating semiconductor components.

The invention applies to monitoring the depth of etching while such components are being fabricated.

BACKGROUND OF THE INVENTION

Techniques for fabricating optoelectronic components make use of a dry etching technique such as reactive ion etching.

Such techniques require in situ monitoring of the depth of etching into the structure constituting the component.

It is common practice to use laser interferometry to perform such monitoring when the structure is made up of thin layers.

Laser interferometry makes it possible to take measurements by means of a reflected laser beam while etching is taking place. The received response signal as reflected from the structure is a function-of the rate of etching and of the complexity of the refractive indices of said structure.

During the etching of a structure made up of a various layers of material, each interface gives rise to a discontinuity in the reflected signal. The derivative of the signal (in the mathematical sense of the term) shows up as a peak that can be used to detect a particular interface.

This property is used to monitor accurately the depth of etching by inserting a marker layer in the structure where growth is to be stopped. The controlling operator or computer can then detect the interface and stop the etching treatment.

The method described above suffers from difficulties of implementation since it becomes uncertain when interfering peaks appear in the response signal or when the structure of the component presents multiple interfaces.

To remedy the problem of interfering peaks appearing, certain interferometer systems installed on dry etching equipment are designed to open a time window for detection and analysis purposes, thereby making it possible to ignore all interfering peaks that lie outside said window.

Unfortunately, that solution requires the rate of etching and the thickness of the material that is to be etched to be known so as to be able to open the detection and analysis window for the reflected signal when the depth of etching has come close to the position of the interface.

Furthermore, that method is not reliable since it does not make it possible to solve the problem of random peaks appearing.

OBJECTS AND SUMMARY OF THE INVENTION

The present invention makes it possible to solve these problems. To this end, the method of the invention includes using at least one set of marker layers or "markers" that are separated by intermediate layers of different refractive index making it possible to produce a response signal (reflected signal) that includes a sequence representative of the index discontinuities between the markers and the intermediate layers.

More particularly, the present invention provides a method of fabricating a semiconductor component, said method including at least one step of etching one or more upper layers formed on a substrate, with the thickness of said etching being defined by a determined vertical position, the method mainly comprising the following steps:

a) prior to forming said upper layer(s), causing at least one set made up of marker layers separated by intermediate layers of predetermined thicknesses to be grown, with the marker layers and the adjacent intermediate layers having different refractive indices; and b) during etching of the upper layer, optically detecting refractive index discontinuities and stopping etching when the sequence of said discontinuities corresponds to a reference sequence representative of the thicknesses of said intermediate layers.

According to another characteristic of the invention, the set of marker layers is constituted by an irregular alternation of marker layers and intermediate layers such that the refractive index discontinuities correspond to a sequence possessing an irregularity. This characteristic makes it possible to discriminate said sequence from a sequence corresponding to periodic noise or to distinguish said sequence from the sequence given by a structure having a periodic stack.

According to another characteristic of the invention, the method consists in causing a plurality of sets of marker layers separated by intermediate layers to be grown at distinct levels in the structure and producing sequences that are distinct due to the refractive index discontinuities of the layers constituting the sets. This characteristic makes it possible to monitor different depths of etching performed on the same structure.

BRIEF DESCRIPTION OF THE DRAWINGS

Other advantages and features of the invention appear on reading the following description which is given by way of non-limiting illustration and with reference to the accompanying drawings, in which;

FIG. 1A is a diagram of a structure enabling the method of the invention to be implemented;

FIG. 1B is a diagram showing a detail of the set of marker layers in FIG. 1A.

FIG. 2 is a diagram of a structure for a variant of the method;

FIG. 3 is a diagram of the signal detected during etching;

FIG. 4 shows the first derivative of the signal of FIG. 3 as a function of time;

FIG. 5 show the second derivative of the FIG. 3 signal as a function of time; and FIG. 6 shows a semiconductor laser made using the method of the invention.

MORE DETAILED DESCRIPTION

The description below relates to a simple semiconductor structure shown in the diagram of FIG. 1. This figure is a cross-section in the width direction through a structure that has not yet been etched.

Typically, and as shown in this example, the semiconductor structure comprises a substrate 1 made of indium phosphide (InP) doped with n-type carriers. The substrate may be covered in a buffer layer (not shown) for facilitating epitaxial growth of the various layers to be stacked, referred to below as the "upper" layers. The layers conventionally stacked on the substrate are constituted, for example, by a first layer-of quaternary material of the GaInAsP type buried under a layer made of a material of III-V type such as InP.

The invention applies to any other semiconductor structure, e.g. a structure using gallium arsenide, such as GaAs or AlGaAs.

According to the method of the invention, epitaxy is used to grow on the substrate 1 a set 50 of marker layers 10, 12, . . . , 20 separated by intermediate layers 11, 13, . . . , 19. The materials selected for this purpose have different refractive indices. In this example, it is preferable to select a quaternary material of GaInAsP type for the marker layers 10, 12, . . . and a material such as InP for the intermediate layers.

To obtain a regular sequence, it suffices for the alternating layers of different index to be regular and for said layers to be of the same thickness. In contrast, to obtain a sequence that has an irregularly (of. FIG. 1B), it is necessary for one or more of the intermediate layers (layer 13 in this figure) to be thicker than the other layers. The thickness of the layers may be 0.4 nm (4 Å) or greater. Naturally, the thickness and the composition of the layers are selected so as to be compatible with the sensitivity of the detection system.

It is preferable to select a set made up of layers that presents irregular index discontinuity, e.g. a sequence 11011 or 10111 or indeed 1101000110 rather than a sequence 1010101 . . . which could be misinterpreted by the detection system and taken as periodic noise or as upper layers having that kind of period.

FIG. 1B shows a detail of the set 50 of marker layers. When making a laser, the thickness of the top layer is 1000 Å, for example, while the thickness of each GaIAsP marker layer and each InP intermediate layer is 20 Å, for example. An 8-bit sequence is obtained using a set having a thickness of 400 Å in which each layer has a thickness of 20 Å.

FIG. 2 shows a variant implementation consisting in burying a second set 51 of marker layers corresponding to a sequence that is different from the first, e.g. a sequence S2 "10111" if the first sequence S1 is "1111011". This example is advantageous when it is desired to make a semiconductor component that requires two successive etching attacks under different operating conditions (different gas or different gas flow rate). Under such circumstances, the upper layers 4, 5 are etched under first operating conditions and then said etching is continued under other operating conditions for the layers 2, 3 situated above the first marker set 50.

By way of example, this structure is used when making a deep ridge type Bragg reflector. The materials used are then InP (1), GaInAsP (2), InP (3), GaInAsP (4).

FIGS. 3, 4, and 5 show respectively the signal R representative of the laser beam reflected by the structure of the component during etching, then its first derivative $dR/dt$, and then its second derivative $d^2R/dt$. The signal R is detected by a conventional laser interferometer system (not shown). The interferometer system includes detection, filtering, and digitizing means for processing the detected signal R. To this end, it includes a real time signal processor unit controlled by a program which computes the first derivative of the signal and the second derivative of the signal which serves to show up the sequence S1 as soon as it is detected.

In practice, the signal S of the laser beam is emitted throughout the duration of the etching operation and the signal R as reflected by the structure is detected and processed in real time.

The detected signal is analyzed at successive time intervals $T_0, T_1, \ldots, T_n$ taken over the total duration T of the etching. The signal detected during each time interval is sampled with a sampling period $t_0$ to obtain p samples where the sequence to be detected has p bits. The samples obtained are compared with a threshold IS that is programmed for this purpose.

As soon as the system detects one or more crossings of the threshold IS, the sequence of values exceeding a threshold is compared with a reference sequence Sref that is stored in the system. Naturally the software for performing this analysis is programmed to slip progressively from one analysis interval to the next $T_0, T_1, \ldots$, etc. so as to recognize the sequence S1 even if it is spread over two successive analysis intervals. The overlap of analysis intervals is of duration to, as shown in FIG. 5.

When a second marker set 51 is provided in the structure, the detection threshold IS can be the same, however the reference sequence will be different since it corresponds to the index discontinuity presented by said set 51 of marker layers that has deliberately been selected to be different from the first set.

FIG. 6 shows an example of a component obtained using the method of the invention. It is a semiconductor laser. In the non-etched locations of the structure, this component contains the set 50 that was used for monitoring etching. The person skilled in the art will naturally select materials for the layers making up the set 50 that do not disturb the operation of the final component.

What is claimed is:

1. A method of fabricating a semiconductor component, said method including at least one step of etching one or more upper layers formed on a substrate, with the thickness of said etching being defined by a determined vertical position, the method comprising the following steps:
 a) prior to forming said upper layer(s), causing at least one set made up of marker layers separated by intermediate layers of predetermined thicknesses to be grown, with the marker layers and the adjacent intermediate layers having different refractive indices; and
 b) during etching of the upper layer, optically detecting refractive index discontinuities and stopping etching when the sequence of said discontinuities corresponds to a reference sequence representative of the thicknesses of said intermediate layers.

2. The method of fabricating a semiconductor component according to claim 1, wherein the set of marker layers is constituted by an irregular alternation of marker layers and intermediate layers such that the refractive index discontinuities correspond to a sequence possessing an irregularity so as to distinguish said sequence from a sequence corresponding to periodic noise or to distinguish said sequence from the sequence given by a structure having a periodic stack.

3. The method of fabricating a semiconductor component according to claim 1, the method consisting in causing a plurality of sets of marker layers separated by intermediate layers to be grown at distinct levels in the structure and producing sequences that are distinct due to the refractive index discontinuities of the layers constituting the sets so as to monitor different depths of etching performed on the same structure.

* * * * *